United States Patent [19]

Oguri et al.

[11] Patent Number: 4,994,703
[45] Date of Patent: Feb. 19, 1991

[54] PIEZOELECTRIC ELEMENT OF LAMINATE TYPE

[75] Inventors: Yasuo Oguri, Tokyo; Noriaki Takahashi, Yokohama; Yukio Chida, Machida, all of Japan

[73] Assignee: Mitsubishi Kasei Corporation, Tokyo, Japan

[21] Appl. No.: 377,046

[22] Filed: Jul. 7, 1989

[30] Foreign Application Priority Data

Jul. 26, 1988 [JP] Japan ................. 63-186374

[51] Int. Cl.⁵ .......................... H01L 41/08
[52] U.S. Cl. ........................ 310/363; 29/25.35; 310/364; 310/366
[58] Field of Search ............ 310/328, 365, 366, 363, 310/364

[56] References Cited

FOREIGN PATENT DOCUMENTS

| 0094078 | 11/1983 | European Pat. Off. | 310/366 |
| 0196071 | 11/1983 | Japan | 310/366 |
| 0065688 | 3/1988 | Japan | 310/366 |

*Primary Examiner*—Mark O. Budd
*Attorney, Agent, or Firm*—Oblon, Spivak, McClelland, Maier & Neustadt

[57] ABSTRACT

A piezoelectric element of laminate type comprising a plurality of films or thin sheets of piezoelectric material of the same size, each having an internal electrode formed on its entire surface, said films or sheets being laminated so that the end face of each internal electrode is exposed at the side of the laminate, wherein an insulating layer is formed by a photosensitive composition to electrically connect every second internal electrode.

8 Claims, 3 Drawing Sheets

(a)

(b)

(c)

(d)

(e)

PIEZOELECTRIC ELEMENT OF LAMINATE TYPE

BACKGROUND OF THE INVENTION

1. Field of the Invention

The present invention relates to a piezoelectric element of laminate type comprising a plurality of sheet members made of piezoelectric material laminated one on another, which expands or contracts in response to an applied voltage.

2. Discussion of Background

Piezoelectric elements of laminate type have a feature that they are capable of generating a large force although the deformation is small. Therefore, they are expected to be applied as various actuators.

However, in order to operate them with a low voltage, it is necessary to reduce the thickness of each sheet of piezoelectric material constituting the laminate. Many proposals have been made to take out every second electrode. One of them is a method in which an insulating layer is coated on the exposed portion of every second internal electrode by a printing method, and a connecting electrode is then coated over the entire side surface of the element for electrical connection. However, it has been difficult by such a method to constantly form fine patterns. Then, it has been proposed to form such an insulating layer by electrophoresis. However, to carry out this method, it is necessary to provide an external electrode for electrophoresis and to cut and remove this external electrode after the formation of the insulating layer, and thus the process is cumbersome.

SUMMARY OF THE INVENTION

Under the circumstances, it is an object of the present invention to overcome the above problems and to provide a piezoelectric element of laminate type having a high performance by a novel method of forming an insulating layer.

The present invention provides a piezoelectric element of laminate type comprising a plurality of films or thin sheets of piezoelectric material of the same size, each having an internal electrode formed on its entire surface, said films or sheets being laminated so that the end face of each internal electrode is exposed at the side of the laminate, wherein an insulating layer is formed by a photosensitive composition to electrically connect every second internal electrode.

BRIEF DESCRIPTION OF THE DRAWINGS

In FIG. 1, reference numeral 1 indicates piezoelectric material, numeral 2 indicates an internal electrode, numeral 3 indicates a photosensitive composition, numeral 4 indicates a mask, and numeral 5 indicates an external electrode.

Figure 1:
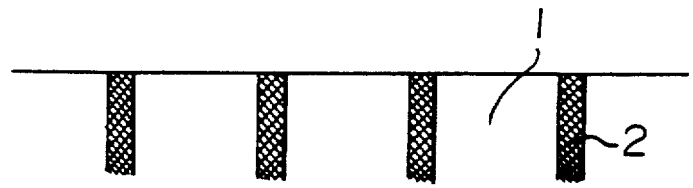
FIG. 1 is a plurality of diagrams illustrating a method for forming the insulating layer of a piezoelectric element of laminate type according to the present invention.
Figure 1:
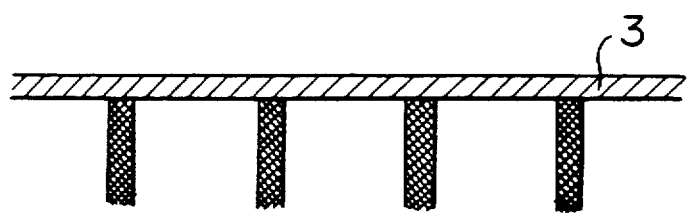
Figure 1:
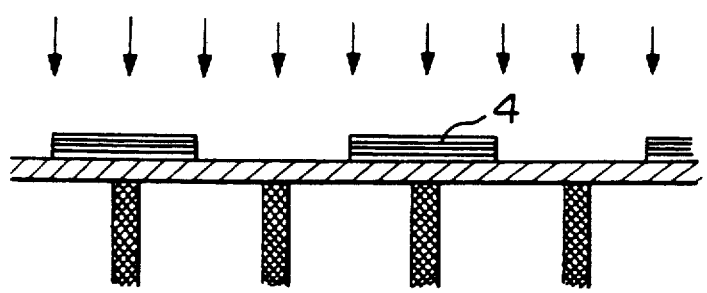
Figure 1:
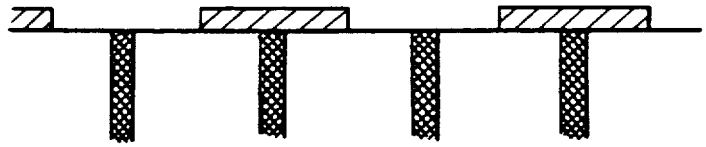
Figure 1:
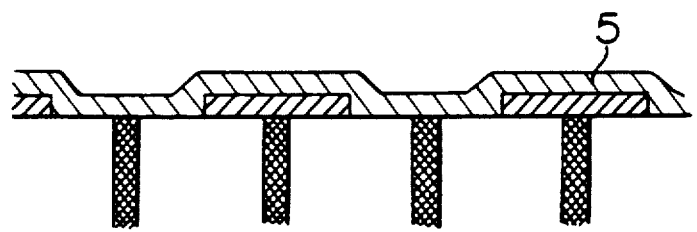

Now, the present invention will be described in detail with reference to the preferred embodiments.

As the piezoelectric material useful for the present invention, $Pb(ZrTi)O_3$ [PZT], $(PbLa)(ZrTi)O_3$ [PLZT] or $PZT-Pb(Mg_{1/3}Nb_{2/3})O_3$ may, for example, be mentioned. Such piezoelectric material may be prepared by a usual method. For example, oxide starting materials may be mixed, calcined and pulverized, or a powder may be obtained by a coprecipitation method.

To obtain a thin piezoelectric ceramics sheet, it is common to employ a doctor blade method for its preparation. Namely, the above-mentioned piezoelectric ceramics starting powders, an organic binder such as polyvinyl alcohol or polyvinyl butyral and a plasticizer such as dibutyl phthalate are mixed, if necessary with an addition of a dispersing agent, to obtain a slurry, which is then cast on e.g. a polyester film, dried and then peeled off from the film to obtain a green sheet. Usually, the thickness of the sheet is preferably from 100 to 500 $\mu$m.

The internal electrode is formed by coating e.g. Pt, Ag-Pd, Pt-Pd, Pd or Ag on the green sheet by e.g. spraying or screen printing.

Then, the green sheet having the internal electrode formed thereon is cut into pieces with a predetermined width and length, which are then laminated, heat-pressed and then subjected to removal of the binder, followed by sintering to obtain a piezoelectric element of laminate type. After sintering, the side on which the external electrode is to be formed, is gently polished to expose the end faces of the internal electrodes. On this side, a photosensitive composition as will be described hereinafter, is coated to form an insulating layer at necessary portions.

The photosensitive composition useful for the present invention may be any composition which is capable of forming an image by exposure and development, such as a photopolymerizable composition, a cinnamic acid group or chalcone group-containing composition, a diazonium salt-containing composition, a quinone diazide group-containing composition, an azide group-containing composition, or a combination of a compound capable of photosensitively generating an acid and a compound having a cation polymerizable group such as an epoxy group. Particularly preferred is a photopolymerizable composition.

As the photopolymerizable composition, it is preferred to employ a photopolymerizable composition comprising (A) a vinyl-type binder polymer, (B) a polymerizable monomer having a polymerizable unsaturated group, (C) a photopolymerization initiator and (D) fine inorganic particles.

The vinyl-type binder polymer (A) as the first component of the photopolymerizable composition can be obtained by the polymerization of e.g. (meth)acrylic acid, a (meth)acrylate, acrylonitrile, styrene, an allyl compound, maleic anhydride or vinyl acetate. Further, it may be a polymer obtained by introducing (meth)acrylic acid by esterification to a (meth)acrylate polymer containing hydroxyethyl (meth)acrylate or hydroxypropyl (meth)acrylate as homopolymer or copolymer, a (co)polymer of diallyl (iso)phthalate and/or triallyl isocyanurate, a polymer obtained by introducing e.g. (meth)acrylic acid, crotonic acid or cinnamic acid to a (co)polymer of glycidyl (meth)acrylate, a polymer obtained by introducing by addition a glycidyl (meth)acrylate to a carboxyl group-containing polymer, a polymer obtained by the addition reaction of a compound containing both a hydroxyl group and a (meth)acryl group to a copolymer of maleic anhydride, or a polymer obtained by introducing by esterification (meth)acrylic acid to a partially hydrolyzed vinyl acetate polymer.

Such a vinyl-type binder polymer preferably has an average molecular weight of at least 2,000 from the viewpoint of the coating properties, the adhesiveness of the coated film surface and the chemical resistance.

The polymerizable monomer (B) having a polymerizable unsaturated group as the second component of the photopolymerizable composition may specifically be an acrylic acid diester or methacrylic acid diester of a diol such as ethylene glycol, tetraethylene glycol, propylene glycol, butane diol or a dihydroxyethyl ether of bisphenol A, a (meth)acrylic acid ester of a trihydric or higher polyol such as trimethylol propane, pentaerythritol, dipentaerythritol or a derivative thereof, or glycerol, trihydroxyethyl isocyanurate or a derivative thereof, a reaction product of a diisocyanate compound with a diol monoacrylate or methacrylate, a (meth)acrylate compound having an phosphoric acid ester group, or a silicone-type (meth)acrylate.

These monomers may be used alone or in combination as a mixture of two or more.

The photopolymerization initiator (C) as the third component of the composition of the present invention may specifically be benzoin, a benzoin alkyl ether, an anthraquinone derivative, a benzanthrone derivative, 2,2-dimethoxy-3-phenylacetophenone, 1-hydroxycyclohexyl phenyl ketone, 2-methyl-[4-(methylthio)-phenyl]-2-morpholino-1-propanone, a benzyl derivative, a benzophenone derivative, 4,4'-bismethylaminobenzophenone, a xanthone derivative, a thioxanthone derivative, a biimidazole, a trichloromethyl-8-triazine, 3,4,3',4'-tetra(t-butylperoxycarbonyl)benzophenone, di-t-butylperoxyisophthalate, as well as their combinations with pigments or with amine compounds such as dialkylaminobenzoic acid alkyl esters, allylthiourea or N-phenylglycine.

The fine inorganic particles (D) as the fourth component of the photopolymerizable composition may specifically be talc, silica, barium sulfate, calcium carbonate, clay, kaolin, bentonite, diatomaceous earth, alumina, sintered talc, titanium dioxide, antimony oxide or zirconium. Such fine inorganic particles may be used after they are treated by surface treatment with a silane coupling agent.

The vinyl-type binder (A) as an essential component of the photopolymerizable composition of the present invention is contained in an amount of from 10 to 80% by weight, more preferably from 20 to 70% by weight, based on the total solid content excluding the solvent for coating.

The polymerizable monomer (B) having a polymerizable unsaturated group as a second essential component of the present invention is contained in an amount of from 10 to 70% by weight, preferably from 15 to 50% by weight.

The photopolymerization initiator (C) is selected within a range of from 0.05 to 10% by weight, preferably from 0.3 to 6% by weight.

Further, the fine inorganic particles (D) are selected within a range of at least 10% by weight, preferably from 20 to 300% by weight, based on the total weight of the vinyl-type binder polymer (A), the polymerizable monomer (B) having a polymerizable unsaturated group and the polymerization initiator (C). If the amount is less than 10% by weight, the heat resistance tends to be poor. On the other hand, if the amount exceeds 300% by weight, no adequate coating properties will be obtained.

Further, the composition of the present invention may contain other additives such as a thermal polymerization inhibitor, a coloring agent, a visible image exposure agent, a flame retardant, a defoamer and an agent for improving the coating properties, as the case requires.

A coating solution is prepared by dissolving or dispersing the necessary components in a solvent for coating.

As the solvent for coating, any solvent may be employed so long as it has a proper boiling point and is capable of dissolving or dispersing the composition. For example, methyl ethyl ketone, methyl isopropyl ketone, ethyl cellosolve, butyl cellosolve, cyclohexanone, methyl cellosolve acetate, butyl cellosolve acetate, methylcarbitol, butylcarbitol acetate, xylene, toluene, propylene glycol monomethyl ether or propylene glycol monoethyl ether acetate may be mentioned.

There is no particular restriction as to the amount of the solvent for coating. However, it is usual to employ it in such an amount that the total solid content will be from 10 to 90% by weight.

FIG. 1 is diagrammatic views illustrating a method for forming the insulating layer of the piezoelectric element of laminate type according to the present invention.

As shown in FIG. 1(b), firstly, a photosensitive composition is coated by e.g. a roll coater, a curtain coater or a screen printing method on the side surface of the piezoelectric element of laminate type. The thickness of the coated composition is preferably from 5 to 50 μm although it depends also on the width of the insulating layer. Then, the solvent is removed from the composition coated on the entire side surface of the piezoelectric element of laminate type, and then exposure and development of an image are conducted as shown in FIGS. 1(c) and (d) to mask the portions where the connecting electrode should not be connected. For exposure, a super high pressure mercury lamp is usually employed. As the developer, 1,1,1-trichloroethane or weakly alkaline water may be used.

Further, as shown in FIG. 1(e), a connecting electrode is formed. The connecting electrode may be formed by applying Pt, Ag-Pd, Pt-Pd, Pd, Ag or a conductive adhesive by coating such as spraying or screen printing, or by sputtering or vapor deposition.

Now, the present invention will be described in further detail with reference to Examples. However, it should be understood that the present invention is by no means restricted to such specific Examples.

EXAMPLE 1

60.1 g of commercially available lead titanate zirconate "60A" (manufactured by Fuji Titan Kogyo K.K.; average particle size: about 1 μm) as piezoelectric material powder, 4.8 g of polyvinyl butyral "LB-1" (manufactured by Sekisui Chemical Co., Ltd.) as organic binder, 2.8 g of dibutyl phthalate as plasticizer, 1.7 g of a dispersing agent and 16.7 g of ethyl cellosolve as solvent, were mixed for 48 hours in a ball mill. The viscosity of the slurry thus obtained was 3,000 cps (12 rpm, 20° C.) as measured by a Brookfield type viscometer.

Figure 2:
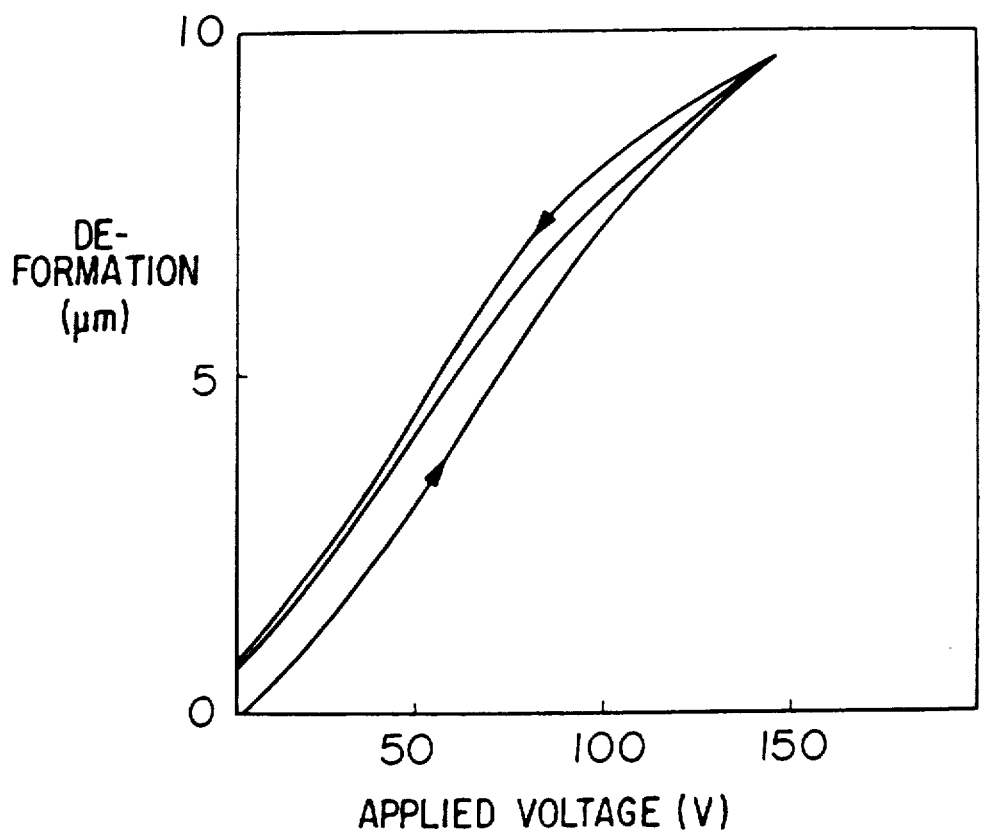
FIG. 2 is a graph showing the relation between the applied voltage and the degree of deformation of the piezoelectric element of laminate type obtained in Example 1.

This slurry was coated in a thickness of 250 μm on a polyester film by means of a casting film-forming device and then dried. The dried sheet was peeled off from the film to obtain a green sheet of piezoelectric material. Then, a paste of Ag-Pd (70:30 in weight ratio) was screen-printed in an average thickness of 5 μm as internal electrode. 50 Sheets of such green sheets were laminated and integrally bonded by heat pressing, followed by sintering at 1,150° C. to obtain a piezoelectric element of laminate type. The side surface was polished to expose the end faces of internal electrodes. Then, a photopolymerizable composition as described hereinafter was coated in a thickness of 30 μm by screen printing. As the photopolymerizable composition, an ink was used which was prepared by dissolving and dispersing in butyl cellosolve, 42 parts by weight of a binder polymer, 31 parts by weight of a compound of the formula II given hereinafter, 22 parts by weight of pentaerythritol triacrylate, 1.7 parts by weight of benzophenone, 0.68 part by weight of Michler's ketone, 1.6 parts by weight of Phthalocyanine Green and 64 parts by weight of talc having an average particle size of 1 μm. After coating, the photopolymerizable composition was dried at 80° C. for 60 minutes. Then, exposure was conducted through a mask film from a distance of 60 cm by a super high pressure mercury lamp of 2 kw, and then spray development was conducted with a 1,1,1-trichloroethane developer for 2 minutes to obtain an image. Further, exposure was conducted at a conveyor speed of 1 m/min from a distance of 20 cm by means of a high pressure mercury lamp with a high intensity of 80 w/cm, and heat treatment was applied at 135° C. for 20 minutes. The same operation was applied to the side surface on the opposite side, and a connecting electrode was provided on each side by means of a silver paste. A voltage of 3 kv/mm was applied across the connecting electrodes for polarization to obtain a piezoelectric element of laminate type of the present invention. The relation between the applied voltage and the degree of deformation of the element of the present invention is shown in FIG. 2.

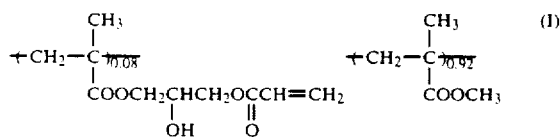

Weight average molecular weight $= 17 \times 10^4$ The weight average molecular weight will hereinafter be represented by Mw.

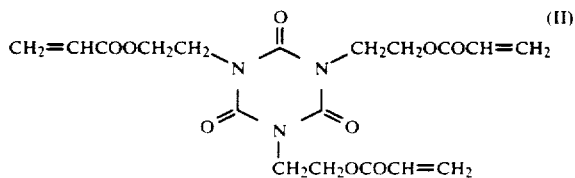

EXAMPLE 2

Figure 3:
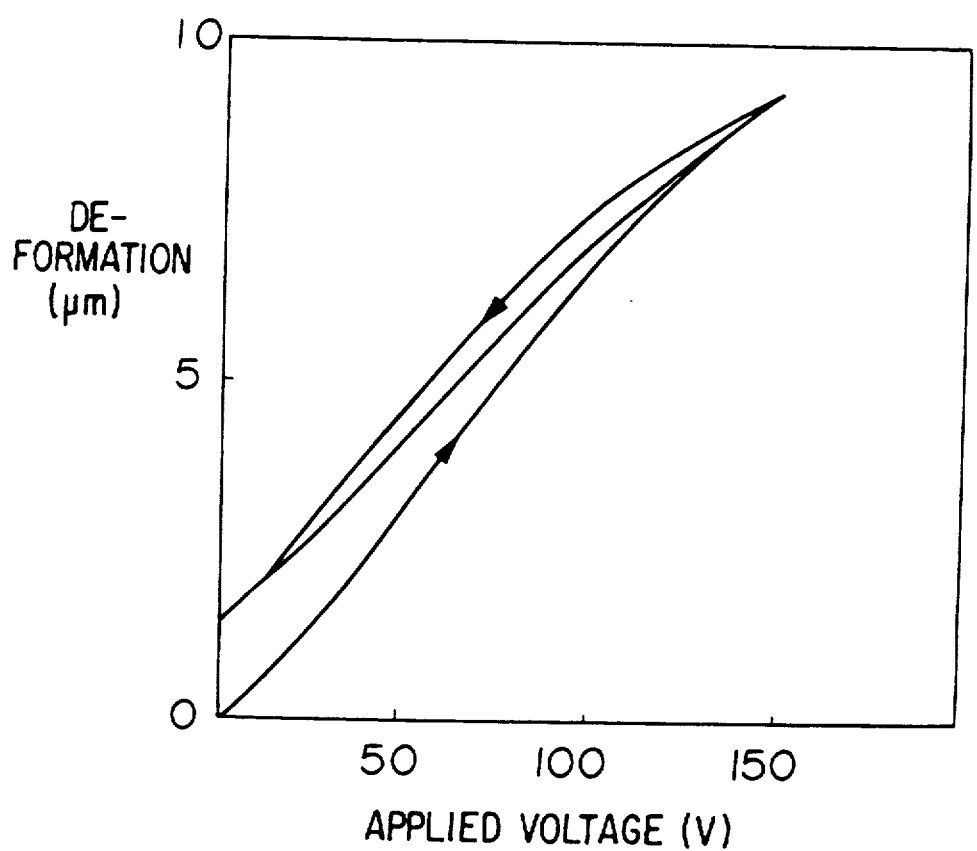
FIG. 3 a graph showing the relation between the applied voltage and the degree of deformation of the piezoelectric element of laminate type obtained in Example 2.

The same piezoelectric material powder as used in Example 1 was granulated to have a size of from 20 to 50 μm and compression-molded (1 t/cm²) by a uniaxial press. This molded product was sintered at 1,250° C. to obtain a piezoelectric sheet having a thickness of 200 μm. On both sides of this sheet, a nickel film having an average thickness of 5 μm was formed as internal electrode by electroless plating. A voltage of 600 V was applied across the electrodes for polarization. An epoxy type adhesive was coated on the surface of such a piezoelectric sheet. 50 such sheets were laminated and heat-pressed to cure the adhesive and to obtain a piezoelectric material of laminate type. The side surface was polished to expose the end faces of the internal electrodes. Thereafter, in the same manner as in Example 1, an insulating layer of a photopolymerizable composition was provided, and a connecting electrode was coated to obtain a piezoelectric element of laminate type of the present invention. The relation between the applied voltage and the degree of deformation of the element of this Example is shown in FIG. 3.

The present invention has a higher level of stability than attainable by the conventional method of attaching a connecting electrode in the piezoelectric elements of laminate type and is applicable to a wide range of different type of laminates.

What is claimed is:

1. A piezoelectric element of a laminate type, comprising:
    a plurality of films of thin sheets of piezoelectric material of the same size, each having an internal electrode formed on its entire surface, said films or sheets being laminated so that the end face of each internal electrode is exposed at the side of the laminate, the end face of every second electrode being covered with an insulating layer formed by a photosensitive composition and then the side of the laminate being covered with a connecting external electrode material which electrically connects every second internal electrode whose end face is not covered with photosensitive composition, said photosensitive composition being a photopolymerizable composition comprising (A) a vinyl-type binder polymer, (B) a polymerizable monomer having a polymerizable unsaturated group, (C) a photopolymerizaton initiator and (D) fine inorganic particles.

2. The piezoelectric element according to claim 8, wherein said piezoelectric material is $Pb(ZrTi)O_3$, $(PbLa)(ZrTi)O_3$, or $Pb(ZrTi)O_3-Pb(Mg_{1/3}Nb_{2/3})O_3$.

3. The piezoelectric element according to claim 8, wherein each film or thin sheet has a thickness of from 100 to 500 μm.

4. The piezoelectric element according to claim 8, wherein the internal electrode is made of Pt, Ag-Pd, Pt-Pd, Pd or Ag.

5. The piezoelectric element according to claim 1, wherein said photopolymerization initiator is benzoin, a benzoin alkyl ether, an anthraquinone derivative, a benzanthrone derivative, 2,2-dimethoxy-3-phenylacetophenone, 1-hydroxycyclohexyl phenyl ketone, 2-methyl-[4-(methylthio)phenyl]-2-morpholino-1-propanone, a benzyl derivative, a benzophenone derivative, 4,4'-bismethylaminobenzophenone, a xanthone derivative, a thoxanthone derivative, a biimidazole, a trichloromethyl-8-triazine, 3,4,3'4'-tetra(t-butylperoxycarbonyl) benzophenone, di-t-butylperoxyisophthalate or combinations thereof with pigments or amine compounds.

6. The piezoelectric element according to claim 8, wherein the insulating layer has a thickness of from 5 to 50 μm.

7. The piezoelectric element according to claim 8, wherein every second internal electrode is electrically connected by a connecting electrode made of Pt, Ag-Pd, Pt-Pd, Pd or Ag.

8. The photopolymerizable composition of claim 1, wherein said fine inorganic particles are particles of talc, silica, barium sulfate, calcium carbonate, clay, kaolin, bentonite, diatomaceous earth, alumina, sintered talc, titanium dioxide, antomony oxide or zirconia.

* * * * *